(12) United States Patent
Kawaguchi et al.

(10) Patent No.: US 7,846,347 B2
(45) Date of Patent: *Dec. 7, 2010

(54) METHOD FOR REMOVING A HALOGEN-CONTAINING RESIDUE

(75) Inventors: Mark N. Kawaguchi, Mountain View, CA (US); James S. Papanu, San Rafael, CA (US); Scott Williams, Sunnyvale, CA (US); Matthew Fenton Davis, Brookdale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 713 days.

This patent is subject to a terminal disclaimer.

(21) Appl. No.: 11/779,972

(22) Filed: Jul. 19, 2007

(65) Prior Publication Data
US 2007/0254489 A1 Nov. 1, 2007

Related U.S. Application Data

(62) Division of application No. 10/777,026, filed on Feb. 11, 2004, now Pat. No. 7,374,696.

(60) Provisional application No. 60/447,406, filed on Feb. 14, 2003.

(51) Int. Cl.
*C03C 15/00* (2006.01)
(52) U.S. Cl. .............................. 216/67; 216/68; 216/69; 216/73; 438/715
(58) Field of Classification Search .................... 216/67, 216/68, 69, 73; 438/715
See application file for complete search history.

(56) References Cited

U.S. PATENT DOCUMENTS

| | | | |
|---|---|---|---|
| 4,936,967 A | 6/1990 | Ikuhara et al. | |
| 5,174,856 A | 12/1992 | Hwang et al. | |
| 5,200,031 A | 4/1993 | Latchford et al. | |
| 5,221,424 A | 6/1993 | Rhoades | |
| 5,306,671 A * | 4/1994 | Ogawa et al. | 438/595 |
| 5,384,009 A | 1/1995 | Mak et al. | |
| 5,397,432 A | 3/1995 | Konno et al. | |
| 5,545,289 A * | 8/1996 | Chen et al. | 438/694 |
| 5,871,658 A | 2/1999 | Tao et al. | |
| 5,877,032 A | 3/1999 | Guinn et al. | |
| 5,986,747 A | 11/1999 | Moran | |
| 6,133,102 A * | 10/2000 | Wu | 438/276 |
| 6,171,981 B1 | 1/2001 | Byun | |
| 6,204,203 B1 * | 3/2001 | Narwankar et al. | 438/785 |
| 6,265,297 B1 | 7/2001 | Powell | |
| 6,331,380 B1 | 12/2001 | Ye et al. | |
| 6,352,870 B1 | 3/2002 | Lansford | |
| 6,492,186 B1 | 12/2002 | Han et al. | |
| 6,521,003 B2 | 2/2003 | Swanepoel et al. | |
| 6,562,713 B1 | 5/2003 | Belyansky et al. | |
| 6,774,045 B1 * | 8/2004 | Liu et al. | 438/709 |
| 2002/0198682 A1 | 12/2002 | Huang et al. | |
| 2003/0015660 A1 | 1/2003 | Shishido et al. | |
| 2003/0183245 A1 * | 10/2003 | Sheu | 134/1.2 |
| 2004/0007561 A1 | 1/2004 | Nallan et al. | |

* cited by examiner

*Primary Examiner*—Binh X Tran
(74) *Attorney, Agent, or Firm*—Alan Taboada; Moser IP Law Group

(57) ABSTRACT

The invention provides for a method and integrated system for removing a halogen-containing residue from a substrate comprising etching the substrate, heating the substrate and exposing the heated substrate to a plasma that removes the halogen-containing residue.

20 Claims, 5 Drawing Sheets

METHOD FOR REMOVING A HALOGEN-CONTAINING RESIDUE

CROSS-REFERENCE TO RELATED APPLICATION

This application is a divisional of U.S. patent application Ser. No. 10/777,026, filed Feb. 11, 2004, now U.S. Pat. No. 7,374,696 B2, which claims the benefit of U.S. Provisional Application No. 60/447,406 filed Feb. 14, 2003. Each of the aforementioned related patent applications is herein incorporated by reference.

BACKGROUND OF THE DISCLOSURE

1. Field of the Invention

The present invention generally relates to a method and apparatus for fabricating devices on a semiconductor substrate. More specifically, the present invention relates to a method and apparatus for removing halogen-containing residue after plasma etching a conducting or semiconducting layer.

2. Description of the Related Art

Ultra-large-scale integrated (ULSI) circuits may include more than one million electronic devices (e.g., transistors) that are formed on a semiconductor substrate, such as a silicon (Si) wafer, and cooperate to perform various functions within the device. Typically, the transistors used in the ULSI circuits are complementary metal-oxide-semiconductor (CMOS) field effect transistors. A CMOS transistor has a gate structure comprising a polysilicon gate electrode and gate dielectric and is disposed between a source region and drain regions that are formed in the wafer.

Fabrication of the electronic devices comprises etch processes in which one or more layers of a film stack (e.g., film stack of the gate structure) are plasma etched and removed, either partially or in total. During plasma etch processes, the layers (e.g., layers of silicon, polysilicon, hafnium dioxide ($HfO_2$), silicon dioxide ($SiO_2$), and the like) are typically exposed to etchants comprising at least one halogen-containing gas, such as hydrogen bromide (HBr), chlorine ($Cl_2$), carbon tetrafluoride ($CF_4$), carbon monoxide (CO), and the like. Such processes cause a halogen-containing residue to build up on the surfaces of the etched features, etch masks, and elsewhere on the wafer.

When exposed to a non-vacuumed environment (e.g., within factory interfaces that interconnect various wafer processing systems) and/or during consecutive processing, the halogen-containing residues release gaseous halogens and halogen-based reactants (e.g., bromine ($Br_2$), chlorine, hydrogen chloride (HCl), and the like). The released halogens and halogen-based reactants cause corrosion and particle contamination of the interior of the processing systems and factory interfaces, as well as corrosion of metallic layers on the substrate. Cleaning of the processing systems and factory interfaces and replacement of the corroded parts is a time consuming and expensive procedure.

Therefore, there is a need in the art for a method of removing a halogen-containing residue from a substrate during fabrication of CMOS transistors and other devices used in the integrated circuits.

SUMMARY OF THE INVENTION

A method and apparatus for removing a halogen-containing residue from a substrate comprises pre-heating the substrate in an atmosphere of oxygen and nitrogen and exposing the pre-heated substrate in a remote plasma reactor to a gas (or gas mixture) comprising oxygen, nitrogen, and an optional hydrogen-containing gas.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

It is to be noted, however, that the appended drawings illustrate only exemplary embodiments of this invention and are therefore not to be considered limiting of its scope, for the invention may admit to other equally effective embodiments.

DETAILED DESCRIPTION

The present invention is a method and apparatus for removing a halogen-containing residue (i.e., a residue containing bromine (Br), chlorine (Cl), and the like) after plasma etching a layer on a semiconductor substrate, e.g., silicon (Si) wafer.

The invention increases the productivity of fabricating integrated electronic devices and is generally used to protect factory interfaces, processing equipment, and metallic layers of the thin film electronic devices from corrosion and particle contamination caused by halogen-based reactants (e.g., $Br_2$, $Cl_2$, and the like). Such reactants are formed when the wafers comprising a halogen-containing residue are exposed, even momentarily, to a non-vacuumed portion (e.g., atmospheric pressure portion) of a facility for fabricating devices on semiconductor wafers, e.g., semiconductor fabrication process.

Figure 1:
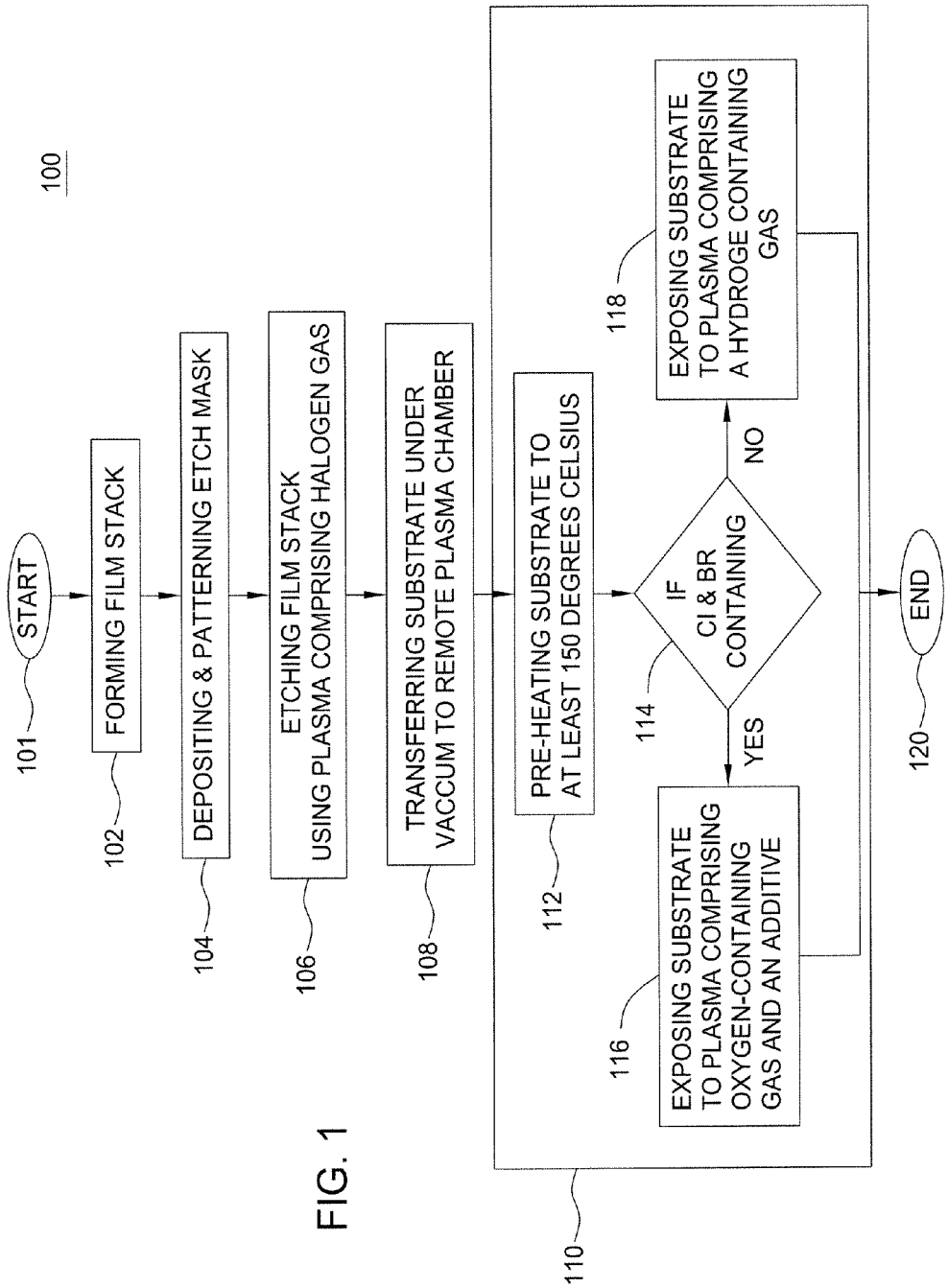
FIG. 1 depicts a flow diagram of a method of removing a halogen-containing residue in accordance with the present invention.

FIG. 1 depicts a flow diagram of a method 100 of removing a halogen-containing residue in accordance with the present invention. In one illustrative embodiment, the method 100 comprises processes performed upon a film stack of a gate structure of a field effect transistor, such as a complementary metal-oxide-semiconductor (CMOS) transistor and the like. Although the invention is described for use during gate structure fabrication, the invention also finds use wherever a halogen-containing residue is to be removed, e.g., shallow trench isolation formation. For best understanding of this embodiment of the invention, the reader should refer simultaneously to FIGS. 1 and 2A-2D.

FIGS. 2A-2D, together depict a sequence of schematic, cross-sectional views of a substrate having a gate structure being formed in accordance with the method 100 of FIG. 1. The cross-sectional views in FIGS. 2A-2D relate to individual processing steps that are used to form the gate structure. Conventional sub-processes (e.g., exposure and development of photoresist, wafer cleaning procedures, and the like) are well known in the art and, as such, are not shown in FIG. 1 and FIGS. 2A-2D. The images in FIGS. 2A-2D are not depicted to scale and are simplified for illustrative purposes.

Figure 2A:
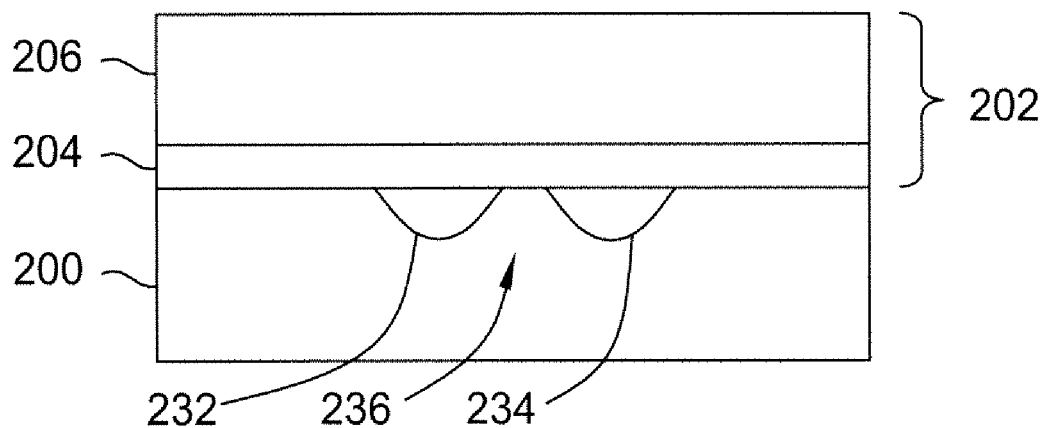
FIGS. 2A-2D, together, depict a sequence of schematic, cross-sectional views of a substrate having a gate structure of a field effect transistor being formed in accordance with the method of FIG. 1.

The method 100 starts at step 101 and proceeds to step 102 when a film stack 202 is formed on a wafer 200 (FIG. 2A). The wafer 200, e.g., a silicon wafer, comprises doped source and drain regions 232 and 234 that are separated by a channel region 236 of the CMOS transistor. These regions are depicted for orientation purposes and are generally not formed until after the gate structure is formed. In an alternative embodiment, the wafer 200 may further comprise a spacer film (not shown). The spacer film generally is used to protect the channel region 236 from diffusive contaminants (e.g., oxygen ($O_2$) and the like) that may be contained in a gate dielectric layer 204. The spacer film may be formed from silicon dioxide ($SiO_2$), silicon nitride ($Si_3N_4$), and the like.

The film stack 202 comprises a doped polysilicon (Si) layer 206 and a dielectric layer 204, e.g., hafnium dioxide ($HfO_2$), silicon dioxide ($SiO_2$), and the like. Other dielectric materials may also be used. In one illustrative embodiment, the polysilicon layer 206 and dielectric 204 are formed to a thickness of about 500 to 6000 Angstroms and about 20 to 60 Angstroms, respectively. Such layers 204 and 206 may be provided using a deposition technique, such as atomic layer deposition (ALD), chemical vapor deposition (CVD), and the like.

Figure 2B:
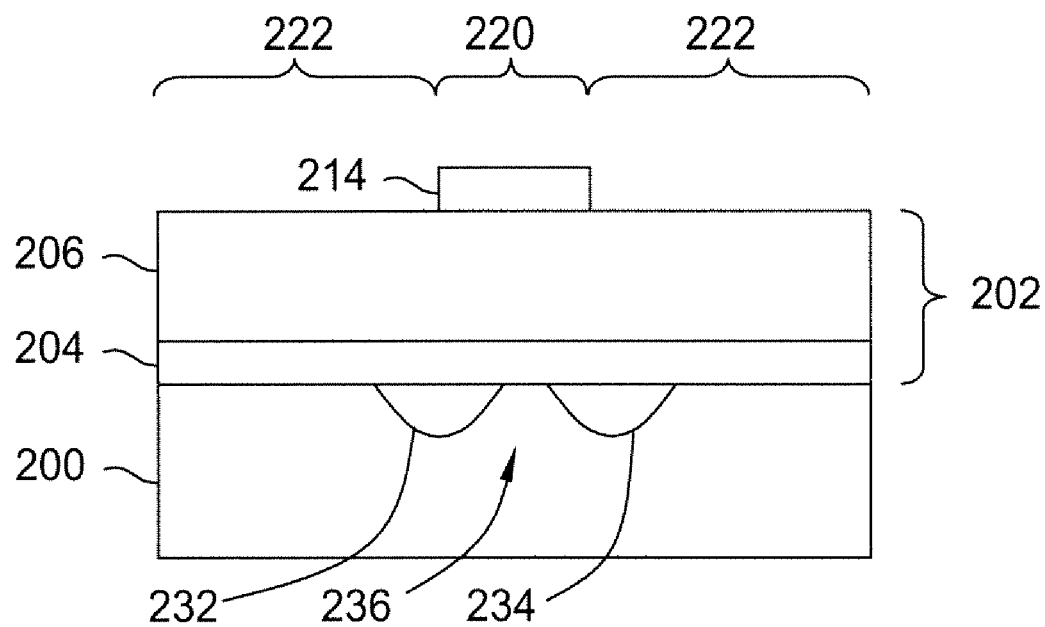

At step 104, a patterned mask 214 is formed on the polysilicon layer 206 (FIG. 2B). The mask 214 is formed in the region 220 to define the location and topographic dimensions of a gate electrode of the gate structure being formed using method 100. Further, the mask 214 protects the channel region 236 and portions of the source and drain regions 232 and 234 that are disposed in the region 220, while exposing the adjacent regions 222 of the wafer 200. The mask 214 is generally a hard mask formed from a material that is stable at the wafer temperatures up to 500° C. The suitable hard mask materials comprise dielectric materials, silicon dioxide, Advanced Patterning Film™ (APF) available from Applied Materials, Inc. of Santa Clara, and the like. In one illustrative embodiment, the mask 214 is formed from silicon dioxide or silicon nitride. Alternatively, in some applications, the mask 214 may be formed from photoresist. Examples of processes for applying various hard and photoresist masks are described, in commonly assigned U.S. patent application Ser. No. 10/245,130, filed Sep. 16, 2002 and U.S. patent application Ser. No. 09/590,322, filed Jun. 8, 2000, which are incorporated herein by reference.

Figure 2C:
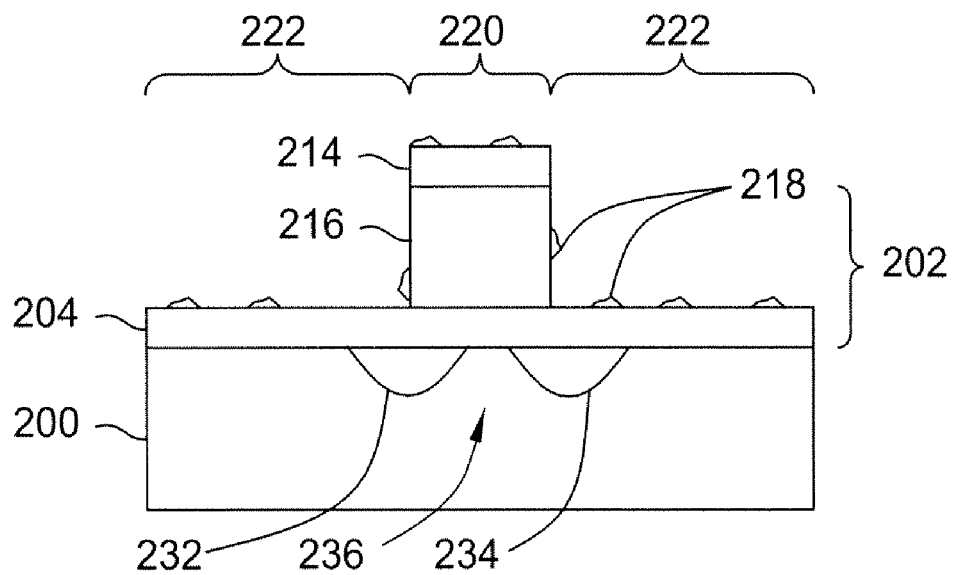

At step 106, the polysilicon layer 206 is etched and removed in the regions 222 (FIG. 2C). A remaining portion of the layer 206 forms in the region 220 a gate electrode 216. Step 106 uses the mask 214 as an etch mask and may use the dielectric layer 204 as an etch stop layer. In one illustrative embodiment, step 106 performs a plasma etch process using a gas (or gas mixture) comprising at least one of hydrogen bromide (HBr), chlorine ($Cl_2$), carbon tetrafluoride ($CF_4$), and the like. Herein the terms "gas" and "gas mixture" are used interchangeably. Step 106 can be performed, for example, using a Decoupled Plasma Source (DPS) reactor of the CENTURA® integrated semiconductor wafer processing system available from Applied Materials, Inc. of Santa Clara, Calif. The DPS reactor uses an inductive source to produce high-density plasma and comprises a source of radio-frequency (RF) power to bias the wafer.

In one embodiment, using the DPS reactor, step 106 provides hydrogen bromide at a rate of 20 to 300 sccm and chlorine at a rate of 20 to 300 sccm (i.e., a $HBr:Cl_2$ flow ratio ranging from 1:15 to all HBr), as well as nitrogen ($N_2$) at a rate of 0 to 200 sccm. Further, step 106 applies 200 to 3000 W of plasma power and 0 to 300 W of bias power and maintains a wafer temperature at 0 to 200° C. and a pressure in the reaction chamber at 2 to 100 mTorr. One exemplary process provides HBr at a rate of 40 sccm and $Cl_2$ at a rate of 40 sccm (i.e., a $HBr:Cl_2$ flow ratio of about 1:1), $N_2$ at a rate of 20 sccm, 1100 W of plasma power, 20 W of bias power, a wafer temperature of 45° C., and a pressure of 4 mTorr.

During step 106, the etched material combines with components of the etchant chemistry, as well as with components of the mask 214 and by-products of the etch process to form a halogen-containing residue 218. The halogen-containing residue 218 deposits on the surfaces of the film stack 202 and elsewhere on the wafer 200. When exposed to atmospheric gases and water vapor, the halogen-containing residue 218 releases (or "outgases") gaseous reactants, such as bromine, chlorine, hydrogen chloride (HCl), and the like. Such reactants may cause corrosion and particle contamination of the processing equipment and factory interfaces, as well as metallic layers (e.g., layers of copper (Cu), aluminum (Al), and the like) on the wafer 200. Generally, wafers are transferred between the vacuumed and non-vacuumed regions of the production environment using an atmospheric pressure factory interface, such as, e.g., a factory interface of the CENTURA® system (discussed in reference to FIG. 4 below). The halogen-based residue 218 should be outgassed and/or the residue should be removed from the wafer 200 before the wafer is transferred to such factory interface.

In an alternative embodiment (not shown), step 106 further etches and removes the dielectric layer 204 in the regions 222 to form the gate electrode 240. Step 106 may use a gas comprising a halogen gas (e.g., chlorine, hydrogen chloride, and the like) and a reducing gas, such as carbon monoxide (CO). Such etch process is disclosed in the commonly assigned U.S. patent application Ser. No. 10/194,566, filed Jul. 12, 2002, which is incorporated herein by reference. In this embodiment, step 106 also develops a halogen-containing residue that should be outgassed and/or removed before the wafer is transferred to the non-vacuumed factory interface.

At step 108, the wafer 200 is transferred under vacuum using, e.g., a robot of the exemplary CENTURA® system to a remote plasma reactor, such as the AXIOM® reactor. The AXIOM® reactor is a remote plasma reactor in which the radio-frequency plasma is confined such that only reactive neutrals are allowed to enter a reaction volume of the process chamber. Such confinement scheme precludes plasma-related damage of the substrate or circuits formed on the substrate. In the AXIOM® reactor, a wafer backside may be heated radiantly by quartz halogen lamps or resistively heated or cooled using heat transfer (e.g., coolant circulating through the wafer support), such that the wafer temperature can be maintained at 20 to 450° C. Similar to the referred to above DPS reactor, the AXIOM® reactor may use an endpoint detection system. The AXIOM® reactor is described in detail in U.S. patent application Ser. No. 10/264,664, filed Oct. 4, 2002, which is herein incorporated by reference. The salient features of the reactor are briefly described below in reference to FIG. 3.

Figure 2D:
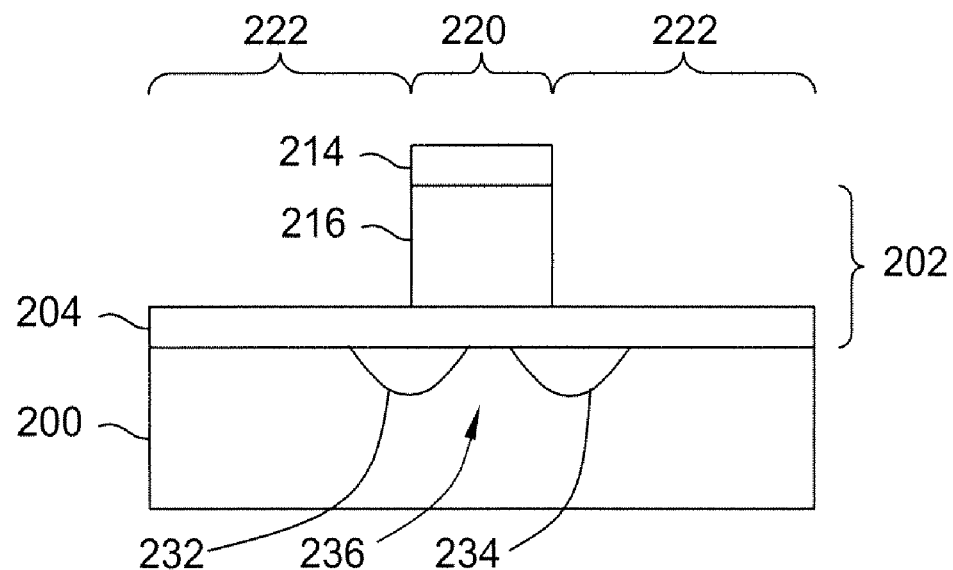

At step 110, the halogen-containing residue 218 is outgassed to release the halogen-based reactants and, in most applications, removed from the wafer 200 (FIG. 2D). Step 110 comprises sub-step 112 of pre-heating the wafer 200, decision sub-step 114, and decision sub-step 116 of exposing the wafer to an oxygen-containing gas (e.g., oxygen, water vapor, and the like) and optionally an additive such as for example nitrogen, argon, helium, and the like. Alternatively, the wafer may be exposed to a hydrogen-containing gas (e.g., hydrogen, forming gas, water vapor, alkanes, alkenes, and the like) and optionally an additive such as oxygen, argon, helium and the like, or sub-step 118 of exposing the wafer to a gas comprising oxygen, nitrogen, and a hydrogen-containing gas, such as at least one of hydrogen ($H_2$), water vapor ($H_2O$), and the like. When the mask 214 is formed from photoresist or APF (both not shown), sub-steps 116 and 118 also simultaneously remove the halogen-containing residue 218 and the mask.

During step 110, the outgassed halogen-based reactants are converted in non-corrosive volatile compounds that are then pumped out from the processing reactor. Upon completion of step 110, the wafer 200 may be transferred for further processing to another processing environment using, e.g., the non-vacuumed factory interface that interconnects various vacuumed and non-vacuumed regions of a semiconductor fab. Alternatively, the wafer may be transferred to another processing chamber within the same processing system (e.g., CENTURA® system).

During sub-step 112, the gas is energized to a plasma in the remote plasma reactor and the wafer 200 is pre-heated to a temperature of at least 150 degrees to about 400° C. Then, the wafer is maintained at such temperature during the remaining portion of step 110. Alternatively, the wafer may be heated and processed simultaneously for improved throughput.

In one embodiment, the wafer 200 is pre-heated to about 250° C. in a gas mixture of oxygen and nitrogen. Oxygen and nitrogen are provided for a duration of about 10-20 sec to the chamber at flow rates of about 5000 sccm and 500 sccm, respectively (i.e., at $O_2:N_2$ flow ratio of about 10:1) at a pressure greater than 1 Torr.

At sub-step 114, the method 100 queries whether the halogen-containing residue 218 comprises bromine. Generally, the residue 218 may contain bromine when step 106 uses a bromine-containing gas, e.g., hydrogen bromide. In a computerized etch reactor, such as the exemplary DPS reactor, at sub-step 114, the decision making routine may be automated using, e.g., a residual gas analyzer (RGA). If the query of step 116 is affirmatively answered, the method 100 proceeds to sub-step 116 or, when the query of sub-step 114 is negatively answered, the method 100 proceeds to sub-step 118.

At sub-step 116, the wafer 200 is exposed to reactants that are formed from a source gas by the plasma source of a remote plasma reactor, e.g., source 306 of the AXIOM® reactor. In one illustrative embodiment, sub-step 116 provides the source gas comprising oxygen and nitrogen at flow rates of about 1000 to 9000 sccm and about 100 to 900 sccm respectively (i.e at $O_2:N_2$ flow ratio of about 10:1). Further, sub-step 116 applies 3000 to 5000 W at about 200 to 600 kHz to form the remote plasma, maintains a wafer temperature between at least 150 and about 400° C. and a gas pressure in the process chamber at about 0.5 to 2 Torr. The duration of substep 116 is generally about 15 to 60 sec.

One exemplary process provides 3500 sccm of $O_2$ and 350 sccm of $N_2$ (i.e., a $O_2:N_2$ flow ratio of about 10:1), 5000 W of plasma power, a wafer temperature of 250° C., a gas pressure of 0.7 Torr, and has a duration of 20 sec. Such process reduces the amount of bromine on the 300 mm wafer from about 250 μg (photoresist mask 214) or about 50-70 μg (hard mask 214) to about or below the detection limit of 3-5 μg. It is believed that, during sub-step 116, the remaining portion (i.e., traces) of bromine becomes oxidized and trapped on the sidewalls of the polysilicon electrode 216.

When the halogen-containing residue 218 comprises a combination of chlorine and bromine, the process of sub-steps 112 and 116 reduces the amount of chlorine from about 300-350 μg to about 5 μg (photoresist mask 214) and to about 10 μg (hard mask 214). However, when the halogen-containing residue 218 comprises chlorine and does not comprise bromine (e.g., step 106 uses a bromine-free gas), the amount of chlorine on the wafer 200 may be as high as 1000 to 3000 μg. In this application, sub-step 116 can reduce the amount of chlorine on the wafer only by a factor of 5-6 (i.e., to about 200-600 μg).

At sub-step 118, the wafer 200 having the halogen-containing residue 218 that does not comprise bromine but comprises chlorine is exposed to the reactants formed by the plasma source of the remote plasma reactor from a source gas comprising oxygen, and a reducing gas to facilitate forming volatile components. The reducing gas may consist of a hydrogen-containing gas such as hydrogen, forming gas (2-5% hydrogen in nitrogen, and in one embodiment, about 4% hydrogen in nitrogen), water vapor, and the like.

In one illustrative embodiment, sub-step 118 provides oxygen at a flow rate of about 1500 to 10,000 sccm and hydrogen-containing gas at a flow rate of about 10 to 2000 sccm (i.e., at $O_2:H_2$ flow ratio of from about 150:1 and 5:1, and $H_2:(H_2$ or $H_2O)$ flow ratio of from about 2:1 and 1:1). Further, sub-step 118 applies 3000 to 6000 W at about 200 to 600 kHz to form the remote plasma and maintains a wafer temperature between at least 50 and about 450° C. and a gas pressure in the process chamber at about 0.5 to 2 Torr. The duration of sub-step 118 is generally about 15 to 60 sec.

One exemplary process provides 3500 sccm of $O_2$ and 800 sccm of forming gas (i.e. $O_2$:forming gas flow ratio of about 5:1, 5000 W of plasma power, a wafer temperature of 250° C., a gas pressure of 0.7 Torr, and has a duration of 20 to 40 sec. Such process reduces the amount of chlorine on the wafer 200 from about 2000-3000 μg to about 7-10 μg.

One exemplary process provides 1000 to 9000 sccm of $O_2$ and 100 to 3000 sccm of water vapor, (i.e. $O_2$:water vapor ratio of about 10:1 to 3:1), 1000 to 6000 W of plasma power, a wafer temperature of 250° C., a gas pressure of 0.5 to 4 Torr, and has a duration of 20 to 60 sec. Such process reduces the amount of chlorine on the wafer 200 from about 2000-3000 μg to about 7-10 μg.

Another exemplary process provides 3500 sccm of $O_2$ and 500 sccm of water vapor (i.e. $O_2$: water vapor flow ratio of 7:1), 5000 W of plasma power, a wafer temperature of 250° C., a gas pressure of 0.7 Torr, and has a duration of 20 sec. Such process reduces the amount of chlorine on the wafer 200 from about 2000-3000 μg to about 7-10 μg.

Another exemplary process provides 500 to 5000 sccm of forming gas, 5000 W of plasma power, a wafer temperature of 250° C., a gas pressure of 0.7 Torr, and has a duration of 20 to 40 sec. Such process reduces the amount of chlorine on the wafer 200 from about 2000-3000 μg to about 7-10 μg.

In one particular embodiment, an exemplary process provides 1000 sccm of forming gas, 5000 W of plasma power, a wafer temperature of 250° C., a gas pressure of 0.7 Torr, and has a duration of 20 to 40 sec. Such process reduces the amount of chlorine on the wafer 200 from about 2000-3000 μg to about 7-10 μg.

Another exemplary process provides 100 to 3000 sccm water vapor, 1000 to 6000 W of plasma power, a wafer temperature of 250° C., a gas pressure of 0.5 to 4 Torr, and has a duration of 20 to 60 sec. Such process reduces the amount of chlorine on the wafer 200 from about 2000-3000 μg to about 7-10 μg.

In one particular embodiment, an exemplary process provides 500 sccm of water vapor, 5000 W of plasma power, a wafer temperature of 250° C., a gas pressure of 0.7 Torr, and has a duration of 20 sec. Such process reduces the amount of chlorine on the wafer 200 from about 2000-3000 μg to about 7-10 μg.

Robust rapid bromine removal requires a high temperature (150-400° C.) and plasma. Inert plasma such as argon, nitrogen, helium and the like may be used. The oxidizing plasma such as $O_2$ also removes photoresist for cases where a photoresist mask is present. Other oxidizers such as water vapor and ozone are also suitable. Oxidizing gases also oxidize all surfaces of the wafer. Additive gases such as nitrogen, argon, helium and water vapor and the like enhance the lifetime of the oxygen radicals.

Robust rapid chlorine (no bromine in etch process) removal requires a high temperature (150-400° C.) and a hydrogen containing plasma. A purely reducing plasma such as hydrogen, forming gas and water vapor and the like may be used. The oxidizing plasma such as $O_2$, water vapor and ozone also removes photoresist for cases where a photoresist mask is present. The oxidation process creates an oxide barrier between any residual chlorine (not removed by the reducing gas) and the atmospheric moisture when the wafer is removed from the vacuum environment. One embodiment uses gas mixture comprising oxygen and forming gas for both chlorine reduction and oxide barrier formation.

High productivity of step 110 allows, using an integrated semiconductor wafer processing system such as the CENTURA® system, to have one remote plasma reactor (AXIOM® reactor) for removing the halogen-containing residue and several plasma etch reactors (e.g., the DPS reactors) for etching the polysilicon and high-K dielectrics (discussed in reference to FIG. 4 below). Alternatively, this process is suitable for use during STI fabrication.

At step 120, the method 100 ends.

Figure 3:
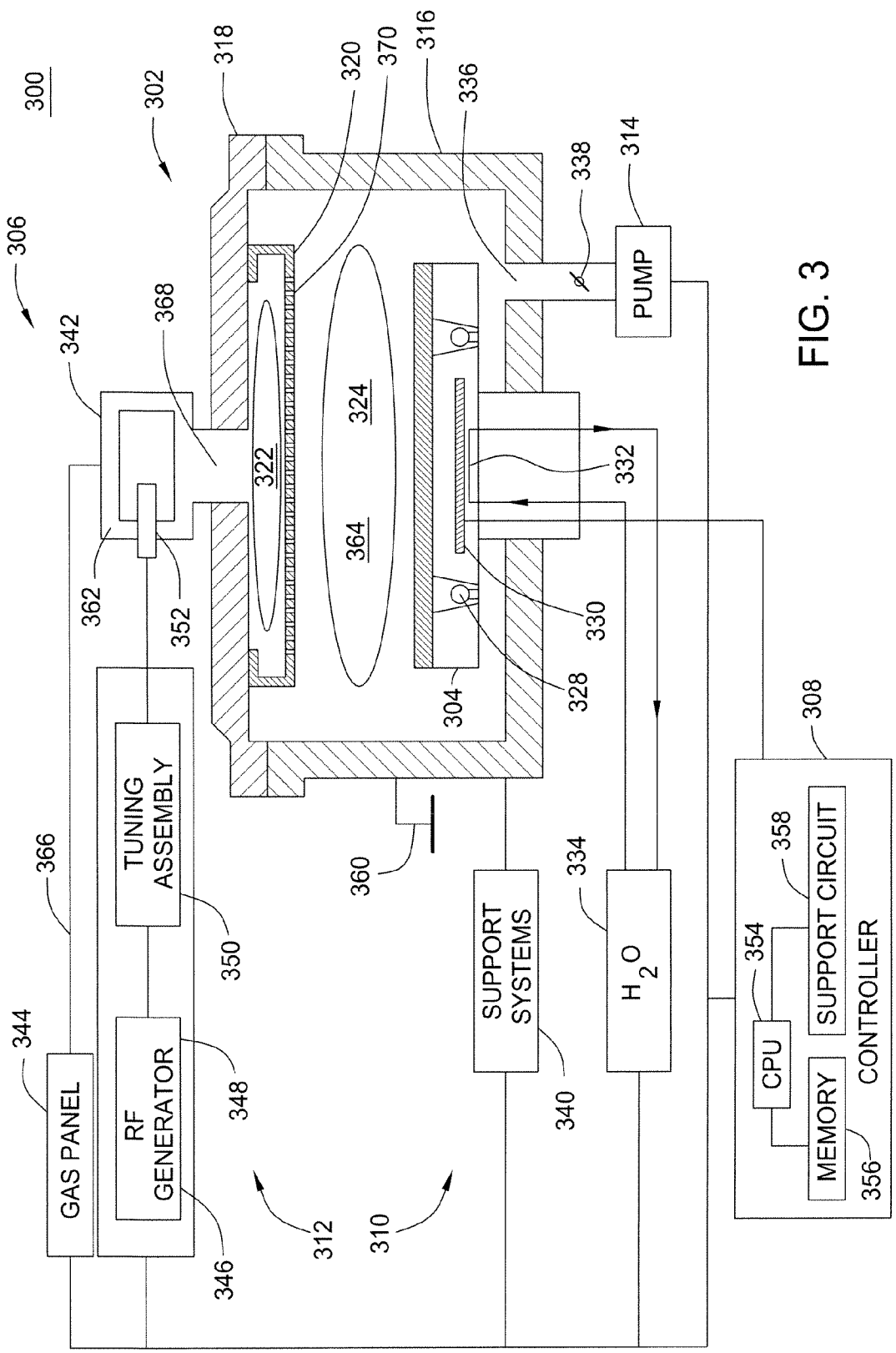
FIG. 3 depicts a schematic diagram of an exemplary remote plasma processing apparatus of the kind used in performing portions of the inventive method.

FIG. 3 depicts a schematic diagram of the AXIOM® reactor 300 that may be used to practice portions of the method 100. The reactor 300 comprises a process chamber 302, a remote plasma source 306, and a controller 308.

The process chamber 302 generally is a vacuum vessel, which comprises a first portion 310 and a second portion 312. In one embodiment, the first portion 310 comprises a substrate pedestal 304, a sidewall 316 and a vacuum pump 314. The second portion 312 comprises a lid 318 and a gas distribution plate (showerhead) 320, which defines a gas mixing volume 322 and a reaction volume 324. The lid 318 and sidewall 316 are generally formed from a metal (e.g., aluminum (Al), stainless steel, and the like) and electrically coupled to a ground reference 360.

The substrate pedestal 304 supports a substrate (wafer) 326 within the reaction volume 324. In one embodiment, the substrate pedestal 304 may comprise a source of radiant heat, such as gas-filled lamps 328, as well as an embedded resistive heater 330 and a conduit 332. The conduit 332 provides cooling water from a source 334 to the backside of the substrate pedestal 304. The wafer sits on the pedestal surface. Gas conduction transfers heat from the pedestal 304 to the wafer 326. The temperature of the wafer 326 may be controlled between about 20 and 400° C.

The vacuum pump 314 is adapted to an exhaust port 336 formed in the sidewall or a bottom wall 316 of the process chamber 302. The vacuum pump 314 is used to maintain a desired gas pressure in the process chamber 302, as well as evacuate the post-processing gases and other volatile compounds from the chamber. In one embodiment, the vacuum pump 314 comprises a throttle valve 338 to control a gas pressure in the process chamber 302.

The process chamber 302 also comprises conventional systems for retaining and releasing the wafer 326, detecting an end of a process, internal diagnostics, and the like. Such systems are collectively depicted in FIG. 3 as support systems 340.

The remote plasma source 306 comprises a power source 346, a gas panel 344, and a remote plasma chamber 342. In one embodiment, the power source 346 comprises a radio-frequency (RF) generator 348, a tuning assembly 350, and an applicator 352. The RF generator 348 is capable of producing of about 200 to 6000 W at a frequency of about 200 to 600 kHz. The applicator 352 is inductively coupled to the remote plasma chamber 342 to inductively couple RF power to process gas (or gas mixture) 364 to form a plasma 362 in the chamber. In this embodiment, the remote plasma chamber 342 has a toroidal geometry that confines the plasma and facilitates efficient generation of radical species, as well as lowers the electron temperature of the plasma. In other embodiments, the remote plasma source 306 may be a microwave plasma source, however, the stripping rates are generally higher using the inductively coupled plasma.

The gas panel 344 uses a conduit 366 to deliver the process gas 364 to the remote plasma chamber 342. The gas panel 344 (or conduit 366) comprises means (not shown), such as mass flow controllers and shut-off valves, to control gas pressure and flow rate for each individual gas supplied to the chamber 342. In the plasma 362, the process gas 364 is ionized and dissociated to form reactive species.

The reactive species are directed into the mixing volume 322 through an inlet port 368 in the lid 318. To minimize charge-up plasma damage to devices on the wafer 326, the ionic species of the process gas 364 are substantially neutralized within the mixing volume 322 before the gas reaches the reaction volume 324 through a plurality of openings 370 in the showerhead 320.

The controller 308 comprises a central processing unit (CPU) 354, a memory 356, and a support circuit 358. The CPU 354 may be of any form of a general-purpose computer processor used in an industrial setting. Software routines can be stored in the memory 356, such as random access memory, read only memory, floppy or hard disk, or other form of digital storage. The support circuit 358 is conventionally coupled to the CPU 354 and may comprise cache, clock circuits, input/output sub-systems, power supplies, and the like.

The software routines, when executed by the CPU 354, transform the CPU into a specific purpose computer (controller) 308 that controls the reactor 300 such that the processes are performed in accordance with the present invention. The software routines may also be stored and/or executed by a second controller (not shown) that is located remotely from the reactor 300.

Figure 4:
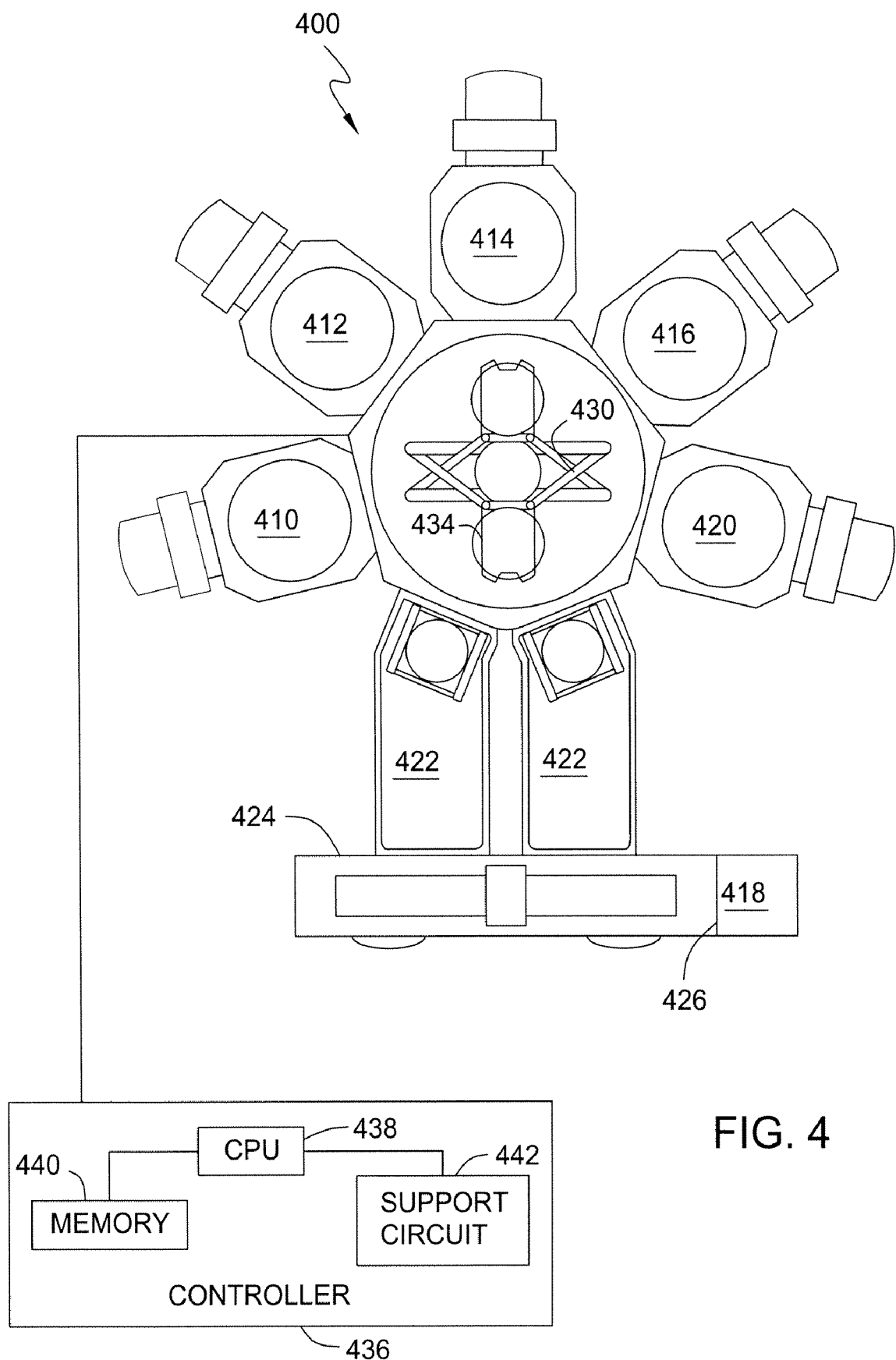
FIG. 4 depicts a schematic plan view of an integrated platform used to perform the method of the present invention.

FIG. 4 is a schematic, top plan view of the exemplary CENTURA® integrated processing system 400. The particular embodiment of the system 400 is provided to illustrate the invention and should not be used to limit the scope of the invention.

The system 400 generally includes load-lock chambers 422, process chambers 410, 412, 414, 416, 420, and a robot 430. The load-lock chambers 422 protect vacuumed plenum 428 (or buffer chamber) of the system 400 from atmospheric contaminants. The robot 430 uses a blade 434 to transfer the substrates between the load lock chambers and process chambers. At least one of the process chambers is a DPS chamber described above in reference to step 106. Further, one or more process chambers may be the AXIOM® chambers described above in reference to step 110. Optionally, at least one of the process chambers may be an annealing chamber or other thermal processing chamber, such as the RADIANCE™ chamber available from Applied Materials, Inc (also mention HART etch chamber from AMHT). The system 400 may also comprise other types of process chambers and/or interfaces to processing systems. Further, the system 400 may comprise one or more external metrology chambers 418 connected thereto using, e.g., a terminal 426 of a factory interface 424. The factory interface 424 is an atmospheric pressure interface that is used to transfer cassettes with the pre-processed and post-processed wafers between various processing systems and manufacturing regions within a semiconductor fabrication process.

The system controller 436 is coupled to and controls each module of the integrated processing system 400. Generally the system controller 436 controls all aspects of operation of the system 400 using a direct control of modules and apparatus of the system 400, or alternatively, by controlling the computers associated with these modules and apparatus. In operation, the system controller 436 enables feedback from the respective modules and apparatus to optimize substrate throughput.

The system controller 436 comprises a central processing unit (CPU) 438, a memory 440, and a support circuit 442. The CPU 438 may be one of any form of a general purpose computer processor that can be used in an industrial setting. The support circuit 442 is conventionally coupled to the CPU 438, and may comprise cache, clock circuits, input/output subsystems, power supplies, and the like. The software routines, when executed by the CPU 438, transform the CPU into a specific purpose compute (controller) 436. The software routines may also be stored and/or executed by a second controller (not shown) that is located remotely from the system 400.

One example of a possible configuration of the system 400 for removing halogen-containing residue in accordance with the present invention includes two load-lock chambers (chambers 422), the PRECLEAN II™ chamber (chamber 410), the AXIOM® chamber (chamber 414), three DPS chambers (chambers 412, 416 and 420), and the metrology chamber (chamber 418).

The invention may be practiced in other semiconductor systems wherein the processing parameters may be adjusted to achieve acceptable characteristics by those skilled in the arts by utilizing the teachings disclosed herein without departing from the spirit of the invention.

Although the foregoing discussion refers to the fabrication of the gate structure of a field effect transistor, fabrication of other devices used in the integrated circuits can benefit from the invention.

While the foregoing is directed to the illustrative embodiment of the present invention, other and further embodiments of the invention may be devised without departing from the basic scope thereof, and the scope thereof is determined by the claims that follow.

What is claimed is:

1. A method for removing a halogen-containing residue from a substrate disposed in a process chamber, comprising:
    providing a substrate having a halogen-containing residue disposed on the substrate, the halogen-containing residue comprising at least one of chlorine or bromine and formed during etching of a polysilicon layer of the substrate;
    heating the etched substrate to a temperature of at least 50° C.; and
    exposing the heated substrate to reactants formed by a plasma remote from the chamber that removes the halogen-containing residue, wherein the plasma comprises hydrogen, water vapor, oxygen, and nitrogen.

2. The method of claim 1, wherein the exposing step further comprises maintaining the temperature of the substrate between from about 50° C. to about 450° C.

3. The method of claim 1, wherein the flow ratio of oxygen to hydrogen is from about 150:1 to about 5:1, and the flow ratio of hydrogen to water vapor is from about 2:1 to about 1:1.

4. The method of claim 1, wherein the hydrogen and nitrogen are at least partially provided by a forming gas having a flow rate of between about 500 to 5000 sccm.

5. The method of claim 1, wherein the flow rate of water vapor is from about 100 to 3000 sccm.

6. The method of claim 1, wherein the flow ratio of oxygen to water vapor of from about 10:1 to 3:1.

7. The method of claim 1, wherein the exposing step further comprises maintaining the temperature of the substrate at about 250° C.

8. The method of claim 1, wherein the heating step comprises heating the substrate in a non-plasma gas mixture of oxygen and nitrogen.

9. The method of claim 8, wherein the substrate is heated in the gas mixture of oxygen and nitrogen for a duration of about 10 to about 20 seconds.

10. The method of claim 8, wherein the gas mixture of oxygen and nitrogen are provided at flow rates of about 5000 sccm of oxygen and about 500 sccm of nitrogen.

11. The method of claim 8, wherein the gas mixture of oxygen and nitrogen are provided at an $O_2:N_2$ flow ratio of about 10:1.

12. The method of claim 8, wherein the substrate is heated at a pressure of greater than about 1 Torr.

13. A method for removing a halogen-containing residue from a substrate, the residue formed during etching of the substrate, comprising:
    providing a substrate having a polysilicon layer on the substrate;
    etching the polysilicon layer and forming a halogen-containing residue comprising at least one of chlorine or bromine on the substrate;
    heating the substrate to a temperature of at least 50° C.; and
    exposing the heated substrate to reactants formed by a plasma remote from the chamber that removes the halogen-containing residue, wherein the plasma comprises hydrogen, water vapor, oxygen and nitrogen.

14. The method of claim 13, wherein the exposing step comprises maintaining the temperature of the substrate between 50° C. and 400° C.

15. The method of claim 13, wherein the etching step comprises etching the substrate with a gas mixture comprising a halogen gas and a reducing gas.

16. The method of claim 13, wherein the heating step comprises heating the substrate in a non-plasma gas mixture of oxygen and nitrogen.

17. The method of claim 16, wherein the substrate is heated in the gas mixture of oxygen and nitrogen for a duration of about 10 to about 20 seconds.

18. The method of claim 16, wherein the gas mixture of oxygen and nitrogen are provided at flow rates of about 5000 sccm of oxygen and about 500 sccm of nitrogen.

19. The method of claim 16, wherein the gas mixture of oxygen and nitrogen are provided at an $O_2:N_2$ flow ratio of about 10:1.

20. The method of claim 16, wherein the substrate is heated at a pressure of greater than about 1 Torr.

* * * * *